United States Patent
Viessmann et al.

(10) Patent No.: US 11,796,615 B2
(45) Date of Patent: Oct. 24, 2023

(54) SUBJECT-SPECIFIC AND HARDWARE-SPECIFIC BIAS REMOVAL FROM FUNCTIONAL MAGNETIC RESONANCE IMAGING SIGNALS USING DEEP LEARNING

(71) Applicant: The General Hospital Corporation, Boston, MA (US)

(72) Inventors: Olivia M. Viessmann, Cambridge, MA (US); Jonathan R. Polimeni, Cambridge, MA (US); Bruce Fischl, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 17/659,599

(22) Filed: Apr. 18, 2022

(65) Prior Publication Data

US 2022/0334206 A1 Oct. 20, 2022

Related U.S. Application Data

(60) Provisional application No. 63/176,124, filed on Apr. 16, 2021.

(51) Int. Cl.
  *G01R 33/48* (2006.01)
  *G01R 33/56* (2006.01)
  *G06N 3/045* (2023.01)

(52) U.S. Cl.
  CPC ..... *G01R 33/4806* (2013.01); *G01R 33/5608* (2013.01); *G06N 3/045* (2023.01)

(58) Field of Classification Search
  CPC ........ G01R 333/5608; G01R 333/4806; G06N 3/045
  See application file for complete search history.

(56) References Cited

U.S. PATENT DOCUMENTS

| 11,630,176 B2* | 4/2023 | Silbersweig | G01R 33/565 382/128 |
|---|---|---|---|
| 2021/0123999 A1* | 4/2021 | An | G01R 33/567 |
| 2021/0401289 A1* | 12/2021 | Yamashita | G06F 18/2136 |

OTHER PUBLICATIONS

Dalca, Adrian V., John Guttag, and Mert R. Sabuncu. "Anatomical priors in convolutional networks for unsupervised biomedical segmentation." Proceedings of the IEEE Conference on Computer Vision and Pattern Recognition. 2018.
(Continued)

*Primary Examiner* — Gregory H Curran
(74) *Attorney, Agent, or Firm* — QUARLES & BRADY LLP

(57) ABSTRACT

Anatomical, physiological, instrumental, and other related biases are removed from functional magnetic resonance imaging ("fMRI") signal data using deep learning algorithms and/or models, such as a neural network. Bias characterization data are used as an auxiliary input to the neural network. The bias characterization data can be subject-specific bias characterization data (e.g., cortical thickness maps, cortical orientation angle maps, vasculature maps), hardware-specific bias characterization data (e.g., coil sensitivity maps, coil transmission profiles), or both. The subject-specific bias characterization data can be extracted from the fMRI signal data using a second neural network. The bias-reduced fMRI signal data can include time-series signals, functional activation maps, functional connectivity maps, or combinations thereof.

27 Claims, 9 Drawing Sheets

(56) References Cited

OTHER PUBLICATIONS

Dalca, Adrian V., John Guttag, and Mert R. Sabuncu. "Unsupervised data imputation via variational inference of deep subspaces." arXiv preprint arXiv: 1903.03503 (2019).
Fischl, Bruce. "FreeSurfer." Neuroimage 62.2 (2012): 774-781.
Greve, Douglas N., and Bruce Fischl. "Accurate and robust brain image alignment using boundary-based registration." Neuroimage 48.1 (2009): 63-72.
Gordon, Evan M., et al. "Precision functional mapping of individual human brains." Neuron 95.4 (2017): 791-807.
Riaz, Atif, et al. "Deep fMRI: AN end-to-end deep network for classification of fMRI data." 2018 IEEE 15th international symposium on biomedical imaging (ISBI 2018). IEEE, 2018.
Ribeiro, Fernanda L., Steffen Bollmann, and Alexander M. Puckett. "DeepRetinotopy: Predicting the Functional Organization of Human Visual Cortex from Structural MRI Data using Geometric Deep Learning." arXiv preprint arXiv:2005.12513 (2020).
Liu, Huan, et al. "The cerebral cortex is bisectionally segregated into two fundamentally different functional units of gyri and sulci." Cerebral Cortex 29.10 (2019): 4238-4252.

Gagnon, Louis, et al. "Quantifying the microvascular origin of BOLD-fMRI from first principles with two-photon microscopy and an oxygen-sensitive nanoprobe." Journal of Neuroscience 35.8 (2015): 3663-3675.
Dinsdale, Nicola K., Mark Jenkinson, and Ana IL Namburete. "Deep learning-based unlearning of dataset bias for MRI harmonisation and confound removal." NeuroImage 228 (2021): 117689.
Ronneberger, Olaf, Philipp Fischer, and Thomas Brox. "U-net: Convolutional networks for biomedical image segmentation." Medical Image Computing and Computer-Assisted Intervention-MICCAI 2015: 18th International Conference, Munich, Germany, Oct. 5-9, 2015, Proceedings, Part III 18. Springer International Publishing, 2015.
Viessmann, Olivia, et al. "BOLD temporal SNR bias and variance across the HCP population as a function of cortical 80-orientation and orientation variability.", 2019.
Viessmann, Olivia, et al. "Dependence of resting-state fMRI fluctuation amplitudes on cerebral cortical orientation relative to the direction of B0 and anatomical axes." Neuroimage 196 (2019): 337-350.

* cited by examiner

SUBJECT-SPECIFIC AND HARDWARE-SPECIFIC BIAS REMOVAL FROM FUNCTIONAL MAGNETIC RESONANCE IMAGING SIGNALS USING DEEP LEARNING

STATEMENT OF FEDERALLY SPONSORED RESEARCH

This invention was made with government support under MH111419, and AG064027 awarded by the National Institutes of Health. The government has certain rights in the invention.

BACKGROUND

Functional MRI ("fMRI") aims to infer neuronal activity from hemodynamic signals and map this activity across the brain. However, the measured fMRI signals contain non-neuronal signal biases imposed by the local vasculature, anatomy, and other physiology. A prominent anatomical bias is the regionally varying partial volume effect that induces fMRI signal differences that covary with cortical thickness changes. Another bias arises from cortical orientation effects, under which fMRI fluctuation amplitudes vary by up to 70% between cortical locations that are parallel versus perpendicular to the $B_0$-direction. Those influences on the fMRI fluctuations are challenging to model directly due to the nonlinear nature of their relationships, precluding straightforward quantification and removal.

Deep learning has been applied to fMRI pattern classification and recent applications include relating functional and anatomical patterns over the folded cortex.

SUMMARY OF THE DISCLOSURE

The present disclosure addresses the aforementioned drawbacks by providing a method for functional magnetic resonance imaging. The method includes accessing functional magnetic resonance imaging ("fMRI") signal data using a computer system, where the fMRI signal data have been acquired from a subject using a magnetic resonance imaging ("MRI") system. Bias characterization data are also accessed with the computer system, where the bias characterization data are indicative of at least one of subject-specific biases affecting the fMRI signal data or hardware-specific biases affecting the fMRI signal data. A neural network is also accessed with the computer system, where the neural network has been trained on training data to remove biases from fMRI signal data. Both the fMRI signal data and the bias characterization data are input to the neural network using the computer system, generating output as bias-reduced fMRI signal data. The bias-reduced fMRI signal data are via the computer system and/or can be displayed to a user using the computer system.

The foregoing and other aspects and advantages of the present disclosure will appear from the following description. In the description, reference is made to the accompanying drawings that form a part hereof, and in which there is shown by way of illustration one or more embodiments. These embodiments do not necessarily represent the full scope of the invention, however, and reference is therefore made to the claims and herein for interpreting the scope of the invention.

DETAILED DESCRIPTION

Figure 1:
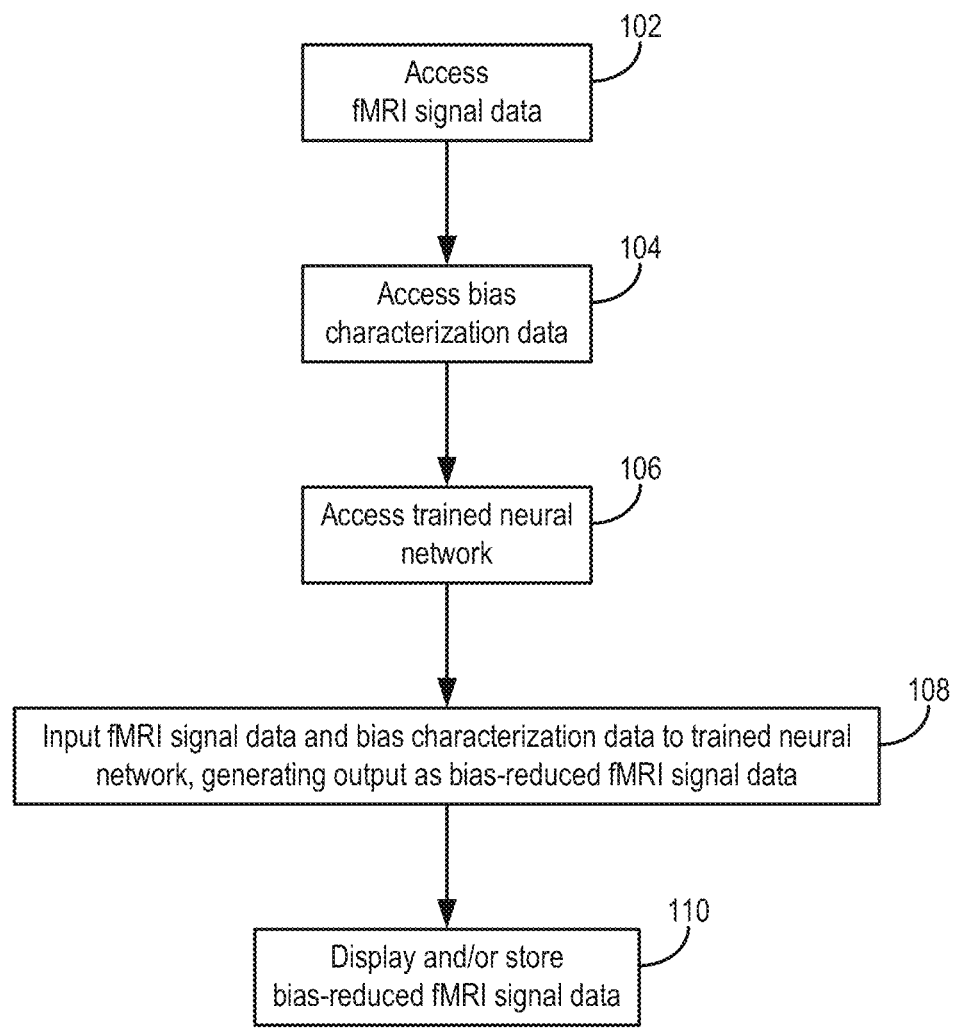
FIG. 1 is a flowchart of an example method for generating bias-reduced fMRI signal data by inputting fMRI signal data and bias characterization data (e.g., subject-specific bas characterization data, hardware-specific bias characterization data) to a suitably trained neural network.

Described here are systems and methods for functional magnetic resonance imaging ("fMRI") in which anatomical, instrumental, and other related biases are removed from the fMRI signal data using deep learning algorithms and/or models. In general, deep learning techniques can be applied to test for the existence and regional variation of anatomical and physiological biases in fMRI signal data. As one non-limiting example, convolutional neural networks ("CNNs") can be implemented to predict anatomical and physiological data from fMRI signal data, which may be presented to a user, or stored for later use (e.g., correcting fMRI signal data, functional activation maps, and/or functional connectivity maps for variances and biases).

In some embodiments, one or more CNNs are trained to predict anatomical feature data, physiological feature data, or both, from fMRI signal data. As an example, one or more CNNs are trained to predict local cortical thickness, cortical orientation to the main magnetic field (i.e., the $B_0$ field), and/or magnetic resonance angiography data from fMRI signal data. Advantageously, these features and/or data can be extracted from fMRI signal data (e.g., resting-state time series data, task-based time series data) and used to reduce variance and/or bias in the original fMRI signal data, thereby improving the quality of functional activation maps or data, functional connectivity maps or data, and the like, which may be estimated or otherwise generated from the fMRI signal data.

Deep learning techniques are able to identify nonlinear relationships between different sets or types of data. In some embodiments, CNNs are trained to learn high-powered fMRI results, which otherwise require many sessions of scan data, from fewer sessions of scan data of lower power. For instance, one or a few runs of fMRI signal data and auxiliary bias characterization maps as input; and the fMRI results of multiple runs as output. Those results can be fMRI activation patterns for a task-based paradigm or functional connectivity patterns from a resting-state experiment. During training, the CNN learns the relationship between bias variability and statistical power variability and how to map between the low-powered single-run data and the high-powered multi-run data results. Once trained, the CNN can be applied to unseen data to infer highly reliable fMRI results without the need to actually acquire multiple runs.

Advantageously, the systems and methods described in the present disclosure can be applied to fMRI imaging data, perfusion imaging data, and permeability imaging data. Additionally or alternatively, the systems and methods can also be extended to other physiological and anatomical MRI techniques. The systems and methods described in the present disclosure allow for reducing the overall scan time needed to achieve significant results and render fMRI studies more cost effective. The systems and methods also offer improvements in fMRI result reliability and interpretability, reduced cost and increase effectiveness, and have the potential to promote the use of fMRI in personalized medicine.

Embodiments of the disclosed deep learning system for bias removal can be applied in fMRI processing of task-based data and resting-state data. CNNs can be trained on an initial set of high-powered multi-session fMRI datasets and then applied to other datasets with fewer fMRI runs per subject. The pretrained CNNs can then be plugged into an fMRI analysis pipeline. If the pretrained CNN performs poorly on the unseen data because it differs substantially in acquisition parameters used during training (e.g., magnetic field strength, $B_0$; spatial or temporal resolution; echo time), the CNN can be refined to the new data via transfer learning. If bias characterization maps are not available, vascular probability maps and coil sensitivity profiles from available atlases can be used as approximations.

Figure 3:
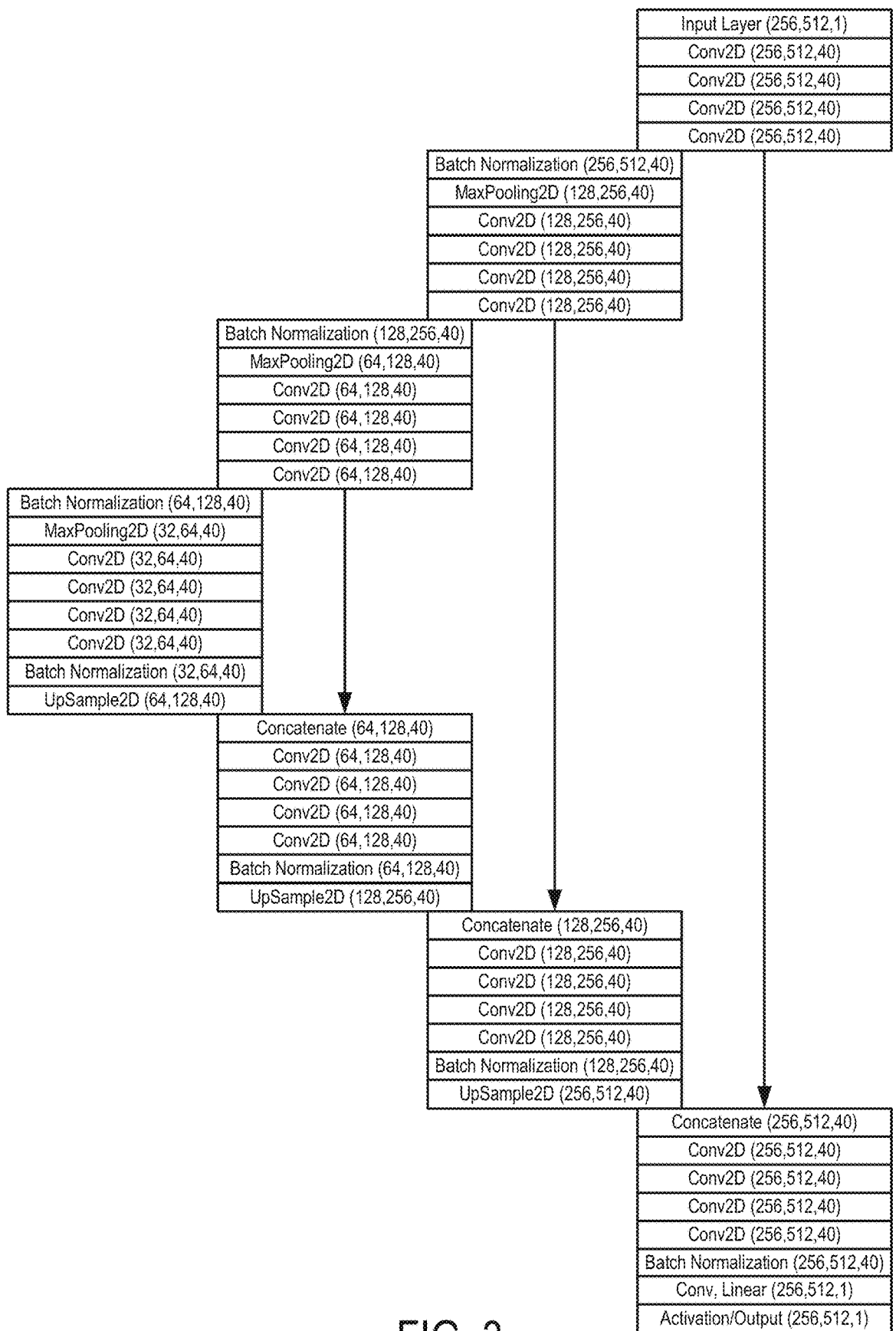
FIG. 3 illustrates an example U-Net architecture for a convolutional neural network that can implement embodiments described in the present disclosure.

Referring now to FIG. 3, a flowchart is illustrated as setting forth the steps of an example method for generating bias-reduced fMRI signal data, which may include fMRI time-series data, functional activation data, and/or functional connectivity data, using a suitably trained neural network applied to lower quality (e.g., single-run) fMRI signal data. In general, a neural network (e.g., a convolutional neural network) is trained to learn high-powered fMRI results that require many sessions of scan data from fewer scan data of lower power, resulting in a deep learning bias removal system. The neural network takes either multiple runs or even a single run of fMRI signal data together with auxiliary bias characterization maps as inputs, and generates bias-reduced fMRI signal data with high quality (e.g., as those from multiple runs) or fMRI inferences as output. Those inferences can be estimated fMRI activation patterns for a task-based paradigm or estimated functional connectivity patterns from a resting-state experiment, or the like.

The method includes accessing fMRI signal data with a computer system, as indicated at step 302. Accessing fMRI signal data may include retrieving such data from a memory or other suitable data storage device or medium. Alternatively, accessing the fMRI signal data may include acquiring such data with an MRI system and transferring or otherwise communicating the data to the computer system, which may be a part of the MRI system.

The fMRI signal data can include task-based fMRI signal data, in which data are acquired while the subject is performing one or more cognitive, motor, behavioral, or other functional tasks, including attending to sensory stimulation; resting-state fMRI signal data, in which data are acquired while the subject is at rest; or both. The fMRI signal data can be acquired using a gradient-echo blood oxygenation level dependent ("BOLD") pulse sequence, such as a gradient-echo echo planar imaging ("EPI") pulse sequence; a spin-echo BOLD pulse sequence, such as a spin-echo EPI pulse sequence; a cerebral blood flow based acquisition technique, such as an arterial spin labeling ("ASL") or functional magnetic resonance angiography ("fMRA") acquisition technique; a cerebral blood volume acquisition technique, such as vascular space occupancy ("VASO"), increased relaxation for optimized neuroimaging ("IRON"), or venous refocusing for volume estimation ("VERVE"); or other such time series based pulse sequences and/or acquisition techniques.

Additionally or alternatively, the fMRI signal data can include other magnetic resonance data associated with blood flow, perfusion, or permeability. As one example, the fMRI signal data may be indicative of perfusion, which may include data acquired using a dynamic susceptibility contrast ("DSC"), dynamic contrast enhancement ("DCE"), or other acquisition technique suitable for acquiring data for perfusion imaging. As another example, the fMRI signal data may be indicative of permeability, which may include data acquired using a DSC acquisition technique. In still other examples, the fMRI signal data can additionally or alternatively include anatomical imaging data, other physiological imaging data, or both.

In general, the fMRI signal data are lower quality data acquired in a fewer number of runs (e.g., a single run), which may introduce undesirable signal biases and variability. Advantageously, these lower quality data can be acquired more rapidly, and as described below the biases can be removed or otherwise reduced to provide higher quality fMRI signal data similar to those acquired using multiple runs.

The method also includes accessing bias characterization data with the computer system, as indicated at step 304. The bias characterization data can include subject-specific bias characterization data, hardware-specific bias characterization data, or both. Accessing bias characterization data may include retrieving such data from a memory or other suitable data storage device or medium. Alternatively, accessing the bias characterization data may include acquiring such data with an MRI system and/or generating bias characterization data from imaging data acquired with an MRI system, after which the bias characterization data are transferred or otherwise communicated to the computer system.

In some instances, the bias characterization data include subject-specific bias characterization data. These data are indicative of subject-specific biases, such as anatomical biases, physiological biases, or both. As a non-limiting example, anatomical and/or physiological biases can include biases related to partial volume effects that vary based on regional changes in cortical thickness, biases imposed by the local vasculature, and/or biases related to fMRI signal amplitude fluctuations based on the orientation of cortical locations relative to the $B_0$ field of the MRI system. Thus, in some embodiments the bias characterization data can include cortical thickness data (e.g., cortical thickness maps), cortical orientation data (e.g., cortical orientation maps), vascular probability data (e.g., vasculature maps), and the like. These subject-specific bias characterization data can be previously generated or acquired from the subject, or can be generated from the fMRI signal data or other data acquired from the subject. For example, as described below in more detail, the subject-specific bias characterization data can be generated by inputting the fMRI signal data (and/or other magnetic resonance imaging data) to a suitably trained neural network, which generates output as subject-specific bias characterization data including cortical thickness maps, cortical orientation maps, and/or vasculature maps. Additionally or alternatively, the subject-specific bias characterization data can be generated using other techniques, such as estimating cortical thickness from anatomical magnetic resonance images, estimating vascular probability maps from magnetic resonance angiography data, available atlases, and so on.

Additionally or alternatively, the bias characterization data include hardware-specific bias characterization data. These data are indicative of hardware-related biases. As a non-limiting example, hardware-related biases can include biases induced or otherwise affected by the radio frequency ("RF") transmission hardware of the MRI system, the RF reception hardware of the MRI system, the main magnetic field of the MRI system, the gradient fields of the MRI system, or combinations thereof. For instance, the hardware-specific bias characterization data can include coil sensitivity data (e.g., coil sensitivity maps or profiles) associated with the RF coil hardware used when acquiring the fMRI signal data from the subject, B1+ map data (e.g., RF transmission maps or profiles) associated with the RF coil hardware transmitting RF fields when acquiring the fMRI signal data, or both.

A neural network, or other machine learning algorithm or model, is then accessed with the computer system, as indicated at step 306. Accessing the neural network may include accessing network parameters (e.g., weights, biases, or both) that have been optimized or otherwise estimated by training the neural network on training data. In some instances, retrieving the neural network can also include retrieving, constructing, or otherwise accessing the particular neural network architecture to be implemented. For instance, data pertaining to the layers in a neural network architecture (e.g., number of layers, type of layers, ordering of layers, connections between layers, hyperparameters for layers) may be retrieved, selected, constructed, or otherwise accessed.

In general, the neural network is trained, or has been trained, on training data in order to generate bias-reduced fMRI signal data based on inputting lower quality fMRI signal data to the neural network. During training, the neural network learns the relationship between bias variability and statistical power variability and how to map between the low-powered single-run data and the high-powered multi-run data results. Once trained, the neural network can be applied to unseen data to infer highly reliable fMRI results (e.g., bias-reduced fMRI signal data) without the need to acquire multiple runs of data. Uniquely, the systems and methods described in the present disclosure takes both fMRI signal data and bias characterization data (e.g., subject-specific and/or hardware-specific bias characterization maps) as input and removes bias that is inherent to each subject (sample) and/or the hardware. As a result, the bias-reduced fMRI signal data can have bias within the subject, across subjects (within dataset), and/or across datasets removed or otherwise reduced.

Figure 2:
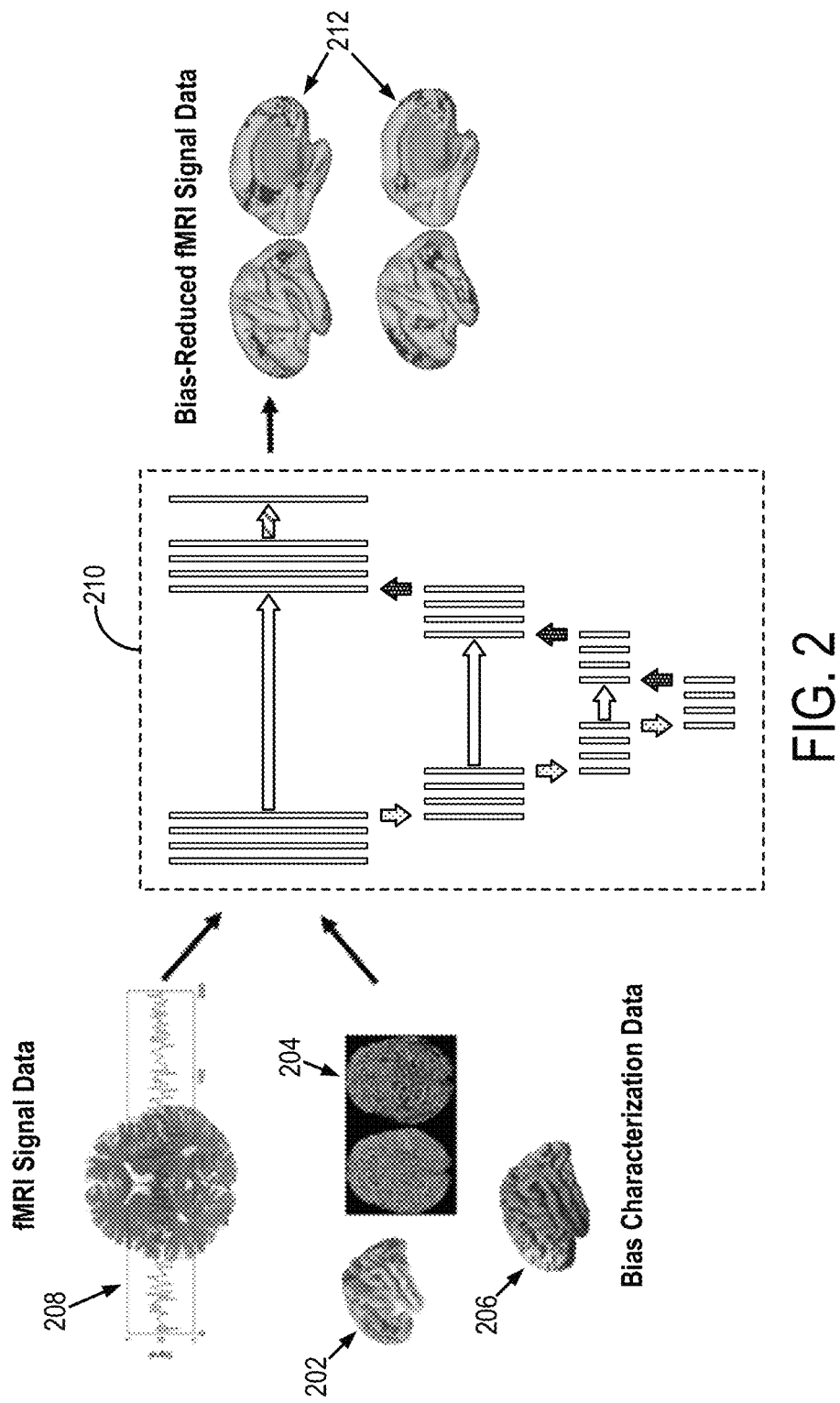
FIG. 2 illustrates an example of generating bias-reduced fMRI signal data (e.g., time-series signals, functional activation maps, functional connectivity maps) by inputting fMRI signal data and bias characterization data to a suitably trained neural network.

An example of a neural network that can be implemented to generate bias-reduced fMRI signal data from lower quality fMRI signal data and bias characterization data is illustrated in FIG. 2. In this example, the neural network is a convolutional neural network ("CNN") based on a U-Net architecture. Bias characterization data including cortical thickness maps 202, vasculature maps 204, and coil sensitivity maps 206 are input to the neural network 208 in addition to fMRI signal data 210. The output bias-reduced fMRI signal data in this example include functional activation and/or functional connectivity data 212.

An example of a U-Net architecture that can be implemented is shown in FIG. 3. In this example neural network architecture, three downsampling levels of four convolutional layers each are utilized. The convolutional kernel size can be 3×3 with 40 features per layer. In the illustrated embodiment, a linear activation is used. In other embodiments, different activation functions can alternatively be utilized.

Referring again to FIG. 3, the fMRI signal data and bias characterization data are then input to the one or more trained neural networks, generating output as bias-reduced fMRI signal data, as indicated at step 308. For example, the bias-reduced fMRI signal data can include fMRI time-series signals that have subject-specific and/or hardware-specific biases removed or otherwise reduced. From these time-series signals, high quality functional activation maps and/or functional connectivity maps can be generated. Additionally or alternatively, the bias-reduced fMRI signal data can include functional activation data (e.g., functional activation maps) and/or functional connectivity data (e.g., functional connectivity maps), such that further processing is not required to generate these data, which may include derived maps (e.g., functional activation maps, functional connectivity maps).

In some embodiments, the fMRI signal data may include surface-based fMRI signal data. The surface-based data can include fMRI signal data that have been mapped or otherwise converted to a surface-based representation, such as by being mapped onto a cortical surface (e.g., an inflated cortical surface, a pial surface). For example, the surface-based data can include fMRI signal amplitude fluctuations that have been mapped onto a cortical surface. In these instances, the surface-based fMRI signal data can be applied directly to a neural network that has been trained to take an input as surface-based data, or the surface-based data can be converted to parameterized surface-based data before being applied to the neural network. Parameterizing surface-based data can include mapping or otherwise converting the surface-based data to a lower dimensional space, such as a two-dimensional space. As an example, the surface-based data can be parameterized using spherical coordinates to a two-dimensional image. In this way, the higher dimensional surface-based data can be represented as a two-dimensional structure that may be more amenable to processing with some neural network architectures.

The bias-reduced fMRI signal data generated by inputting the fMRI signal data and bias characterization data to the trained neural network(s) can then be displayed to a user, stored for later use or further processing, or both, as indicated at step 310. In those instances where the bias-reduced fMRI signal data include only fMRI time-series signals, functional activation maps and/or functional connectivity maps can be generated from the time-series signals using known fMRI processing techniques.

Figure 4:
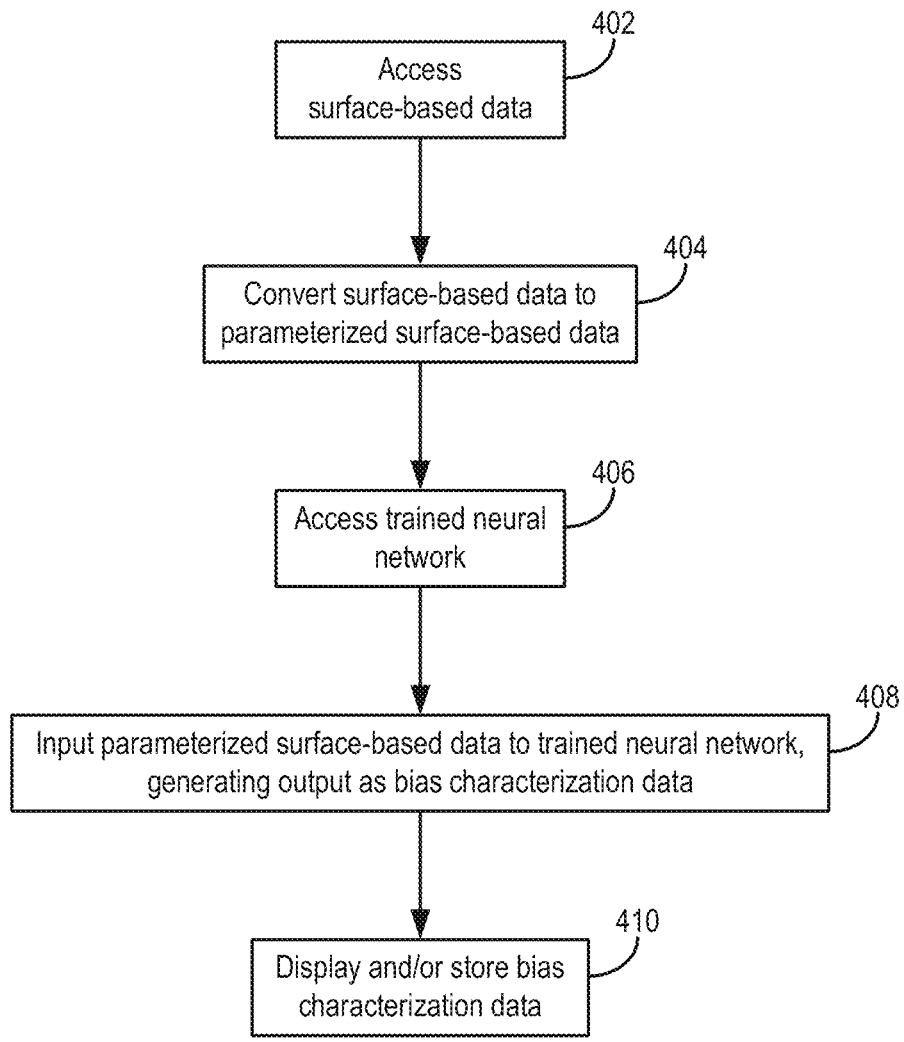
FIG. 4 is a flowchart of an example method for generating bias characterization data (e.g., subject-specific bias characterization data) by inputting fMRI signal data to a suitably trained neural network.

Referring now to FIG. 4, a flowchart is illustrated as setting forth the steps of an example method for generating bias characterization data (e.g., bias characterization maps) using a suitably trained neural network or other machine learning algorithm applied to surface-based data, such as fMRI signal data that have been mapped to a cortical surface (e.g., a cerebral cortical surface).

The method includes accessing surface-based data with a computer system, as indicated at step 402. Accessing surface-based data may include retrieving such data from a memory or other suitable data storage device or medium. Alternatively, accessing the surface-based data may include acquiring such data with an MRI system or otherwise generating the surface-based data from magnetic resonance imaging data acquired with an MRI system and transferring or otherwise communicating the surface-based data to the computer system, which may be a part of the MRI system.

The surface-based data can include fMRI signal data or other magnetic resonance imaging data that have been mapped or otherwise converted to a surface-based representation, such as by being mapped onto a cortical surface (e.g., an inflated cortical surface, a pial surface). For example, the surface-based data can include fMRI signal amplitude fluctuations that have been mapped onto a cortical surface.

The surface-based data are then converted into parameterized surface-based data, such as two-dimensional images or maps, as indicated at step 404. As an example, the surface-based data can be parameterized using spherical coordinates to a two-dimensional image. In this way, the higher dimensional surface-based data can be represented as a two-dimensional structure that may be more amenable to processing with a neural network. In some other embodiments, the surface-based data may be applied as a direct input to a suitably trained and structured neural network (e.g., a neural network that is configured to receive higher dimensional data structures as an input).

A neural network, or other machine learning algorithm or model, is then accessed with the computer system, as indicated at step 406. Accessing the neural network may include accessing network parameters (e.g., weights, biases, or both) that have been optimized or otherwise estimated by training the neural network on training data. In some instances, retrieving the neural network can also include retrieving, constructing, or otherwise accessing the particular neural network architecture to be implemented. For instance, data pertaining to the layers in a neural network architecture (e.g., number of layers, type of layers, ordering of layers, connections between layers, hyperparameters for layers) may be retrieved, selected, constructed, or otherwise accessed.

In general, the neural network is trained, or has been trained, on training data in order to convert parameterized surface-based data into bias characterization data, such as subject-specific bias characterization data. As a non-limiting example, the neural network can be trained to learn a relationship between parameterized surface-based data (e.g., parameterized fMRI signal amplitude fluctuations) to subject-specific bias characterization data such as cortical thickness maps, cortical orientation maps, or the like. The output bias characterization data are parameterized into the same two-dimensional space (e.g., spherical coordinate space) as the input data. In some embodiments, the bias characterization data can be converted back into a surface-based representation (e.g., by mapping the bias characterization data onto a cortical surface map or model).

In some instances, more than one machine learning algorithm may be accessed. For example, a first machine learning algorithm may have been trained on first training data to generate cortical thickness map based on inputting parameterized surface-based data to the first machine learning algorithm, and a second machine learning algorithm may have been trained on second training data to generate cortical orientation maps based on inputting parameterized surface-based data to the second machine learning algorithm.

Figure 5:
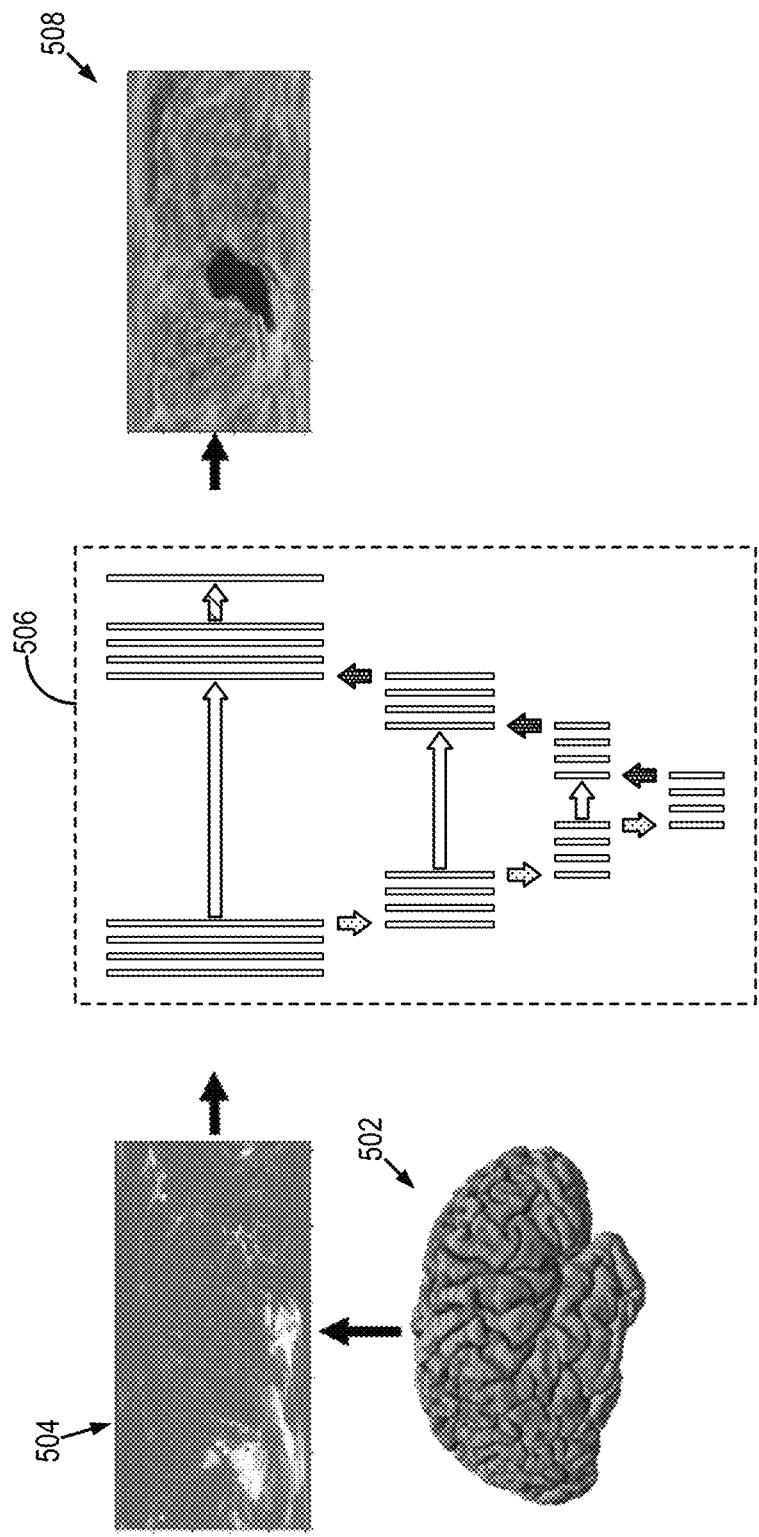
FIG. 5 illustrates an example of generating bias characterization data by inputting fMRI signal data to a suitably trained neural network.

An example of a neural network that can be implemented to generate bias characterization data from surface-based data is illustrated in FIG. 5. In this example, the neural network is a CNN based on a U-Net architecture. Surface-based data 502 (e.g., fMRI signal data mapped to a cortical surface) are parameterized to a two-dimensional image 504, which are then input to a neural network 506. The output bias characterization data 508 in this example include cortical thickness data that are parameterized as two-dimensional cortical thickness maps.

Referring again to FIG. 4, the parameterized surface-based data are then input to the one or more trained neural networks, generating output as bias characterization data, as indicated at step 408. For example, the bias characterization data may include feature maps associated with cortical thickness, cortical orientation, vasculature maps, and the like.

Figure 6A:
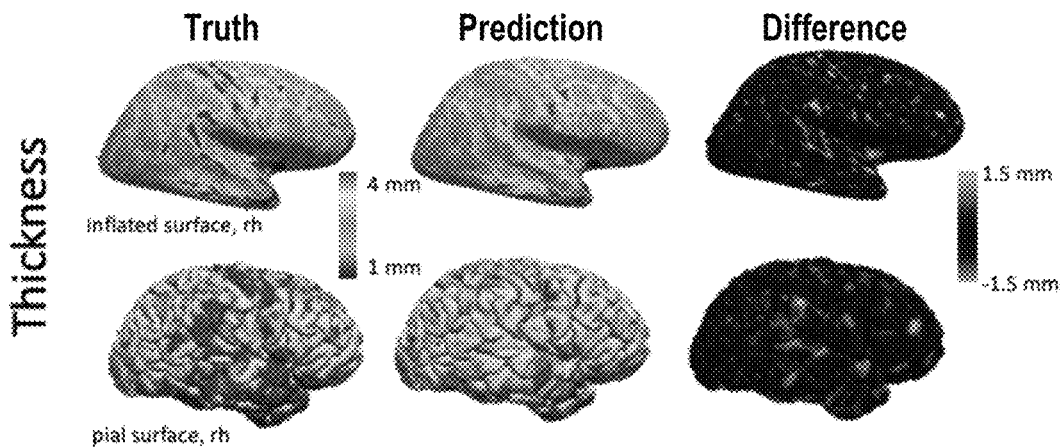
FIGS. 6A-6C illustrate examples of subject-specific bias characterization data generated using the methods described in the present disclosure, including cortical thickness maps (FIG. 6A); vasculature maps, such as magnetic resonance angiography ("MRA") intensity maps (FIG. 6B); and cortical orientation angle maps (FIG. 6C).
Figure 6B:
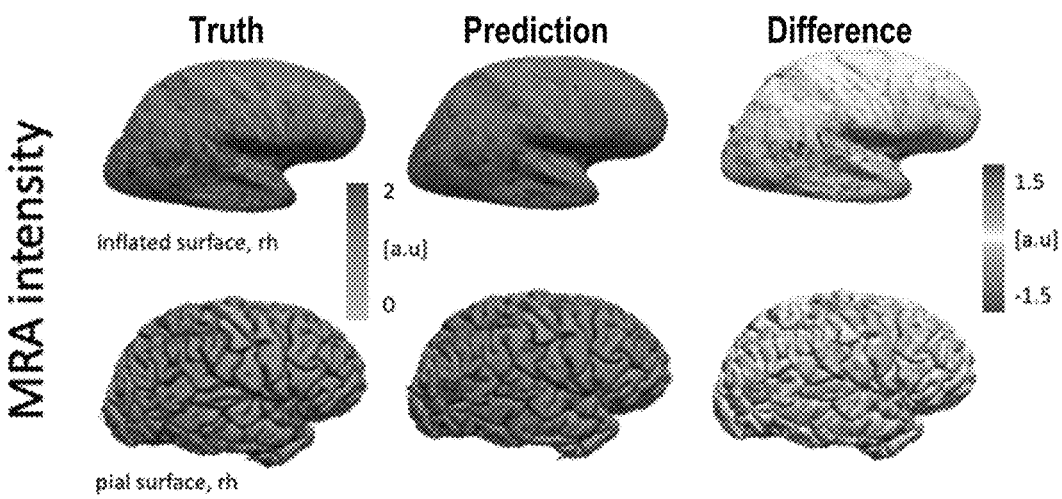
Figure 6C:
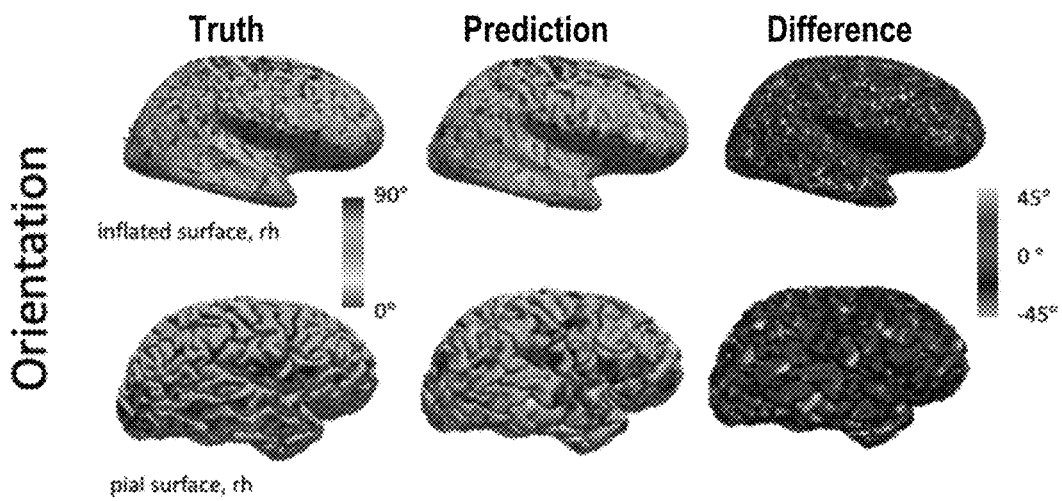

Examples of bias characterization data generated by applying surface-based data and/or parameterized surface-based data to a suitably trained neural network are shown in FIG. 6A-6C. These figures depict the results of example CNN predictions for a test subject. True and predicted cortical thickness maps are shown in FIG. 6A, true and predicted MRA intensity maps are shown in FIG. 6B, and true and predicted cortical orientation angle maps are shown in FIG. 6C. Feature maps are displayed on the inflated and pial surface. The prediction error varies spatially, but generally the pattern of error is unstructured with some focal regions exhibiting higher predictability than others. Generally, in this example the predicted feature maps appear to be a smoothed version of the ground truth feature maps.

The bias characterization data generated by inputting the parameterized surface-based data to the trained neural network(s) can then be displayed to a user, stored for later use or further processing, or both, as indicated at step 410.

Figure 7:
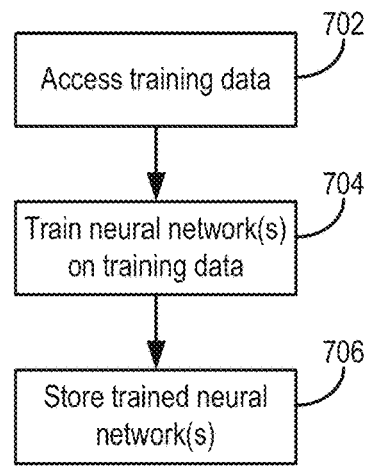
FIG. 7 illustrates a flowchart of an example method for training a neural network on training data, which may be trained on suitable training data to generate bias-reduced fMRI signal data from fMRI signal data and bias characterization data, or to generate bias characterization data from fMRI signal data, as described in the present disclosure.

Referring now to FIG. 7, a flowchart is illustrated as setting forth the steps of an example method for training one or more neural networks on training data, such that the one or more neural networks are trained to receive input as fMRI signal data and bias characterization data in order to generate output as bias-reduced fMRI signal data, or alternatively to receive input as surface-based data in order to generate output as bias characterization data.

In general, the neural network(s) can implement any number of different model architectures or algorithm types. For instance, the neural network(s) could implement a convolutional neural network, a residual neural network, or other artificial neural network. In some instances, the neural network(s) may implement deep learning. Alternatively, the neural network(s) could be replaced with other suitable machine learning algorithms, such as those based on supervised learning, unsupervised learning, deep learning, ensemble learning, dimensionality reduction, and so on.

As one non-limiting example, the neural network can include a convolutional neural network based on a U-Net architecture. An example U-net-like architecture that can be implemented in some embodiments is illustrated in FIG. 3.

Referring again to FIG. 7, the method includes accessing training data with a computer system, as indicated at step

702. Accessing the training data may include retrieving such data from a memory or other suitable data storage device or medium. Alternatively, accessing the training data may include acquiring such data with an MRI system and transferring or otherwise communicating the data to the computer system, which may be a part of the MRI system. Additionally or alternatively, accessing the training data may include generating or otherwise assembling training data from magnetic resonance imaging data, fMRI signal data, or the like.

In some embodiments, when the neural network is being trained to learn a relationship between lower quality fMRI signal data and higher quality, bias-reduced fMRI signal data the training data can include lower quality fMRI signal data, bias characterization data, and higher quality fMRI signal data. For instance, the bias characterization data can include subject-specific bias characterization maps acquired for a group or population; hardware-specific bias characterization maps acquired from a plurality of different MRI hardware (e.g., different RF coils, different MRI systems), over repeated acquisitions with the same MRI hardware, or combinations of both; or combinations of both subject-specific and hardware-specific bias characterization data.

In other embodiments, when the neural network is being trained to learn a relationship between surface-based data (e.g., fMRI signal data or other magnetic resonance imaging data mapped to a cortical surface), the training data can include surface-based data and/or parameterized surface-based data as well as bias characterization data and/or parameterized bias characterization data. For instance, the bias characterization data can include cortical thickness maps, vasculature maps, and/or cortical orientation angle maps. These maps can be two-dimensional images (e.g., representative of a parameterized surface), or can be surface-based maps (e.g., where the images have been mapped onto a cortical surface).

Accessing the training data can, in some instances, include assembling training data from fMRI signal data, bias characterization data, and/or surface-based data using a computer system. This step may include assembling the training data into an appropriate data structure on which the neural network can be trained. Assembling the training data may include assembling fMRI signal data, bias characterization data, and/or surface-based data, and other relevant data. For instance, assembling the training data may include generating labeled data and including the labeled data in the training data. Labeled data may include fMRI signal data, bias characterization data, and/or surface-based data, or other relevant data that have been labeled as belonging to, or otherwise being associated with, one or more different classifications or categories. Creating labeled data may include labeling all data within a field-of-view of the data, or may include labeling only those data in one or more regions-of-interest within the data. The labeled data may include data that are classified on a voxel-by-voxel basis, or a regional or larger volume basis.

One or more neural networks are trained on the training data, as indicated at step 704. In general, the neural network(s) can be trained by optimizing network parameters (e.g., weights, biases, or both) based on minimizing a loss function. As one non-limiting example, the loss function may be a mean squared error loss function.

Training a neural network may include initializing the neural network, such as by computing, estimating, or otherwise selecting initial network parameters (e.g., weights, biases, or both). Training data can then be input to the initialized neural network, generating output data (e.g., intermediate bias-reduced fMRI signal data, intermediate bias characterization data). The quality of the output data can then be evaluated, such as by passing the output data to the loss function to compute an error. The current neural network can then be updated based on the calculated error (e.g., using backpropagation methods based on the calculated error). For instance, the current neural network can be updated by updating the network parameters (e.g., weights, biases, or both) in order to minimize the loss according to the loss function. When the error has been minimized (e.g., by determining whether an error threshold or other stopping criterion has been satisfied), the current neural network and its associated network parameters represent the trained neural network.

The one or more trained neural networks are then stored for later use, as indicated at step 706. Storing the neural network(s) may include storing network parameters (e.g., weights, biases, or both), which have been computed or otherwise estimated by training the neural network(s) on the training data. Storing the trained neural network(s) may also include storing the particular network architecture to be implemented. For instance, data pertaining to the layers in the network architecture (e.g., number of layers, type of layers, ordering of layers, connections between layers, hyperparameters for layers) may be stored.

In an example study, a dataset containing magnetic resonance data acquired from ten subjects was used to generate bias-reduced fMRI signal data in accordance with some embodiments described in the present disclosure. The example dataset included ten sessions of 30-minute resting-state fMRI per subject, and additional anatomical data (T1-weighted images) and MR angiography data acquired on a 3T MRI scanner. The T1-weighted images were acquired using a sagittal MPRAGE pulse sequence (0.8 mm isotropic resolution), and the MRA data were acquired such that each subject had four sagittal (0.8×0.8×2 mm) and four coronal (0.7×0.7×2.5 mm) 2D-stacked time-of-flight image series without saturation pulses (so both arteries and veins were detected). The fMRI signal data were acquired using a gradient-echo EPI pulse sequence (4×4×4 mm, TR=2.2 s, TE=27 ms, flip angle=90 degrees, 36 slices).

The T1-weighted images were processed with the FreeSurfer software package to reconstruct cortical surfaces and calculate cortical thickness. Surfaces were rigidly transformed into the subject's head position during each fMRI scan and the surface orientation angles relative to the $B_0$-axis were calculated. All eight MRA datasets were rigidly registered to the T1-weighted images, after which they were intensity normalized by the mean signal from a white matter mask (to remove signal variations across subjects) and these data were this data onto the exterior "pial" surface representing the gray matter/cerebrospinal fluid ("CSF") border. Finally, the MRA projections were averaged to generate a single vasculature feature map, which may be referred to as an "MRA intensity" map (e.g., as seen in FIG. 6B). The fMRI signal data were distortion and motion corrected, and a boundary-based registration was applied to align the fMRI data to the T1-weighted images. The coefficient of variation (i.e., $\sigma/\mu$, the fMRI time-series' temporal standard deviation over the mean) was calculated as the normalized fMRI fluctuation amplitude. These data were projected onto the surface at the middle cortical depth (e.g., thereby generating surface-based data). As described above, the feature surface projections were mapped into a spherical coordinate system (i.e., a global two-dimensional parameterization of the surface data), generating parameterized surface-based data for input to the neural network(s).

The neural network architecture illustrated in FIG. 3 was implemented for the CNN. The network was trained to predict cortical thickness, cortical orientation angle, and/or MRA intensity from the fMRI signal data input. In some implementations, a separate neural network can be trained for each output. In other implementations, a single neural network can be trained to output all three feature maps. For each feature, the neural network(s) was trained ten times on nine of the ten subjects (circularly hold-one-out). Left and right hemispheres were treated as independent maps, which yielded 180 datasets for training of which 162 were used. The trained networks were applied to a randomly selected run of the held-out subject for testing.

As described above, the output bias characterization data can then be used as an auxiliary input to a different neural network for estimating bias-reduced fMRI signal data (e.g., fMRI time-series signals, functional activation maps, functional connectivity maps) from an input fMRI signal dataset.

Figure 8:
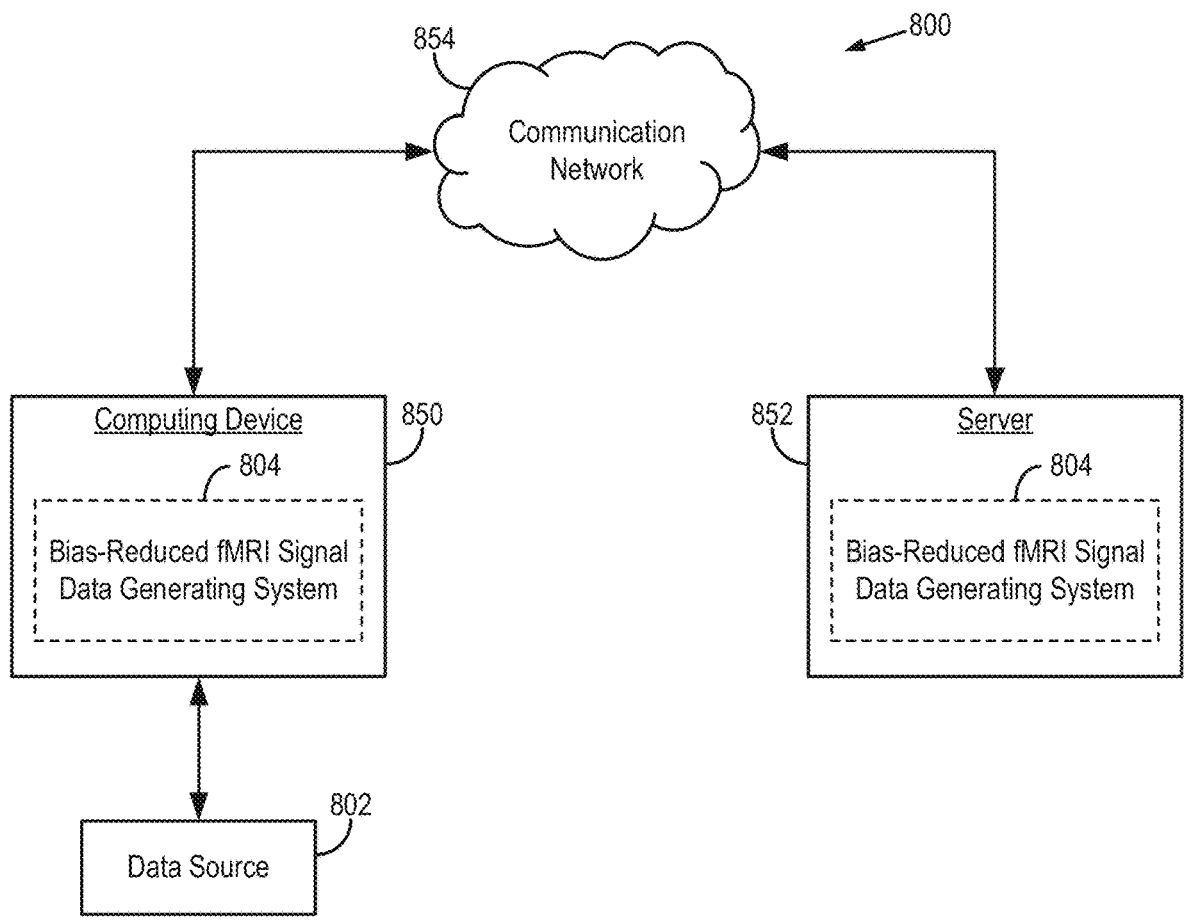
FIG. 8 is a block diagram of an example system for generating bias-reduced fMRI signal data in accordance with some embodiments described in the present disclosure.

Referring now to FIG. 8, an example of a system 800 for generating bias-reduced fMRI signal data in accordance with some embodiments of the systems and methods described in the present disclosure is shown. As shown in FIG. 8, a computing device 850 can receive one or more types of data (e.g., fMRI signal data, magnetic resonance imaging data, bias characterization data, surface-based data) from data source 802. In some embodiments, computing device 850 can execute at least a portion of a bias-reduced fMRI signal data generating system 804 to generate bias-reduced fMRI signal data from the data received from the data source 802 and/or to generate bias characterization data from the data received from the data source 802.

Additionally or alternatively, in some embodiments, the computing device 850 can communicate information about data received from the data source 802 to a server 852 over a communication network 854, which can execute at least a portion of the bias-reduced fMRI signal data generating system 804. In such embodiments, the server 852 can return information to the computing device 850 (and/or any other suitable computing device) indicative of an output of the bias-reduced fMRI signal data generating system 804.

In some embodiments, computing device 850 and/or server 852 can be any suitable computing device or combination of devices, such as a desktop computer, a laptop computer, a smartphone, a tablet computer, a wearable computer, a server computer, a virtual machine being executed by a physical computing device, and so on. The computing device 850 and/or server 852 can also reconstruct images from the data, generate surface-based data from the data, generate functional activation maps from the data, generate functional connectivity maps from the data, and/or generate bias characterization maps from the data.

In some embodiments, data source 802 can be any suitable source of data (e.g., measurement data, images reconstructed from measurement data, processed image data), such as an MRI system, another computing device (e.g., a server storing measurement data, images reconstructed from measurement data, processed image data), and so on. In some embodiments, data source 802 can be local to computing device 850. For example, data source 802 can be incorporated with computing device 850 (e.g., computing device 850 can be configured as part of a device for measuring, recording, estimating, acquiring, or otherwise collecting or storing data). As another example, data source 802 can be connected to computing device 850 by a cable, a direct wireless link, and so on. Additionally or alternatively, in some embodiments, data source 802 can be located locally and/or remotely from computing device 850, and can communicate data to computing device 850 (and/or server 852) via a communication network (e.g., communication network 854).

In some embodiments, communication network 854 can be any suitable communication network or combination of communication networks. For example, communication network 854 can include a Wi-Fi network (which can include one or more wireless routers, one or more switches, etc.), a peer-to-peer network (e.g., a Bluetooth network), a cellular network (e.g., a 3G network, a 4G network, etc., complying with any suitable standard, such as CDMA, GSM, LTE, LTE Advanced, WiMAX, etc.), other types of wireless network, a wired network, and so on. In some embodiments, communication network 854 can be a local area network, a wide area network, a public network (e.g., the Internet), a private or semi-private network (e.g., a corporate or university intranet), any other suitable type of network, or any suitable combination of networks. Communications links shown in FIG. 8 can each be any suitable communications link or combination of communications links, such as wired links, fiber optic links, Wi-Fi links, Bluetooth links, cellular links, and so on.

Figure 9:
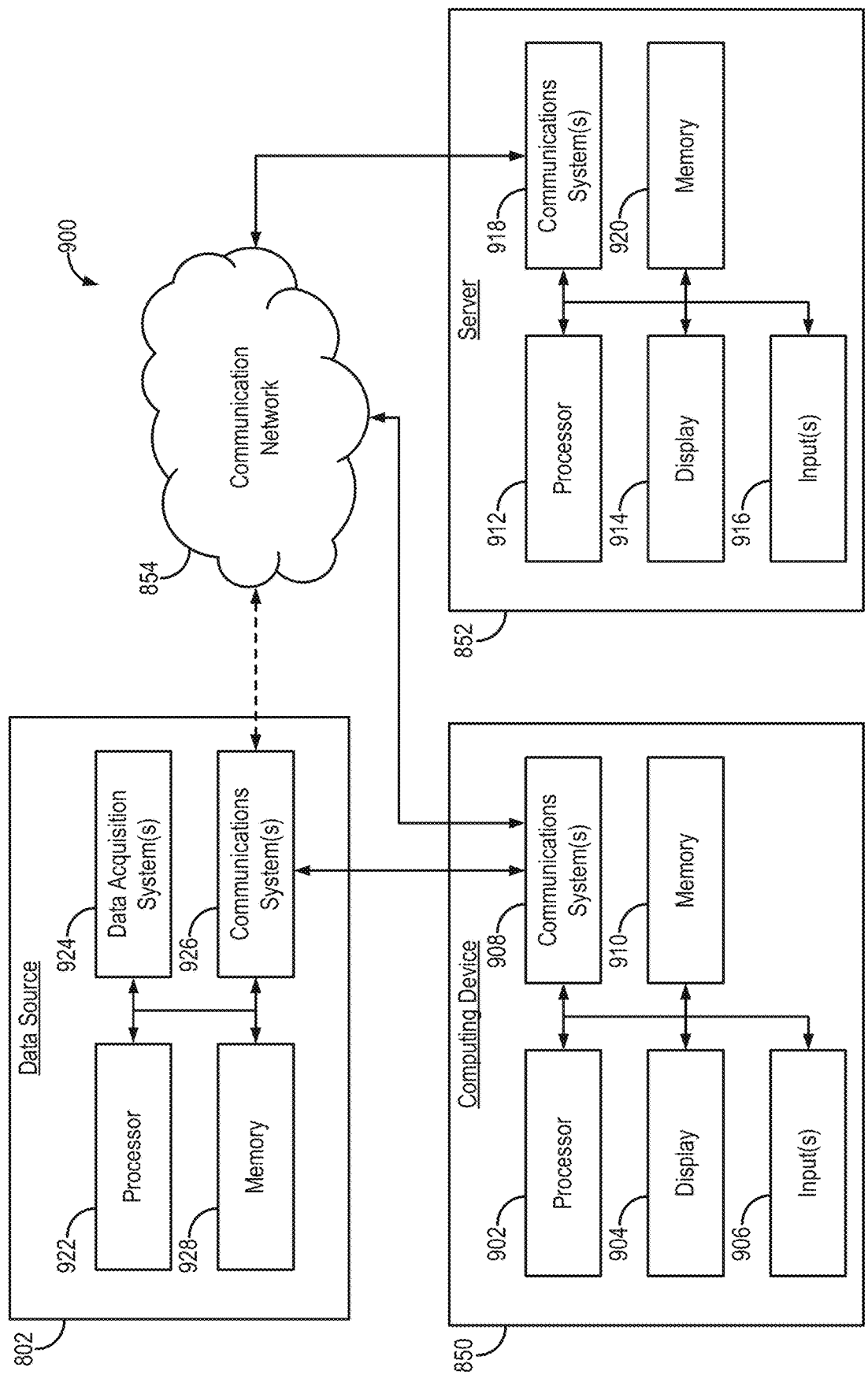
FIG. 9 is a block diagram of example components that can implement the system of FIG. 8.

Referring now to FIG. 9, an example of hardware 900 that can be used to implement data source 802, computing device 850, and server 852 in accordance with some embodiments of the systems and methods described in the present disclosure is shown.

As shown in FIG. 9, in some embodiments, computing device 850 can include a processor 902, a display 904, one or more inputs 906, one or more communication systems 908, and/or memory 910. In some embodiments, processor 902 can be any suitable hardware processor or combination of processors, such as a central processing unit ("CPU"), a graphics processing unit ("GPU"), and so on. In some embodiments, display 904 can include any suitable display devices, such as a liquid crystal display ("LCD") screen, a light-emitting diode ("LED") display, an organic LED ("OLED") display, an electrophoretic display (e.g., an "e-ink" display), a computer monitor, a touchscreen, a television, and so on. In some embodiments, inputs 906 can include any suitable input devices and/or sensors that can be used to receive user input, such as a keyboard, a mouse, a touchscreen, a microphone, and so on.

In some embodiments, communications systems 908 can include any suitable hardware, firmware, and/or software for communicating information over communication network 854 and/or any other suitable communication networks. For example, communications systems 908 can include one or more transceivers, one or more communication chips and/or chip sets, and so on. In a more particular example, communications systems 908 can include hardware, firmware, and/or software that can be used to establish a Wi-Fi connection, a Bluetooth connection, a cellular connection, an Ethernet connection, and so on.

In some embodiments, memory 910 can include any suitable storage device or devices that can be used to store instructions, values, data, or the like, that can be used, for example, by processor 902 to present content using display 904, to communicate with server 852 via communications system(s) 908, and so on. Memory 910 can include any suitable volatile memory, non-volatile memory, storage, or any suitable combination thereof. For example, memory 910 can include random-access memory ("RAM"), read-only memory ("ROM"), electrically programmable ROM ("EPROM"), electrically erasable ROM ("EEPROM"), other forms of volatile memory, other forms of non-volatile memory, one or more forms of semi-volatile memory, one or more flash drives, one or more hard disks, one or more solid state drives, one or more optical drives, and so on. In some embodiments, memory 910 can have encoded thereon, or otherwise stored therein, a computer program for controlling operation of computing device 850. In such embodiments, processor 902 can execute at least a portion of the computer program to present content (e.g., images, user interfaces, graphics, tables), receive content from server 852, transmit information to server 852, and so on. For example, the processor 902 and the memory 910 can be configured to perform the methods described herein (e.g., the method of FIG. 1; the method of FIG. 4; and/or the method of FIG. 7).

In some embodiments, server 852 can include a processor 912, a display 914, one or more inputs 916, one or more communications systems 918, and/or memory 920. In some embodiments, processor 912 can be any suitable hardware processor or combination of processors, such as a CPU, a GPU, and so on. In some embodiments, display 914 can include any suitable display devices, such as an LCD screen, LED display, OLED display, electrophoretic display, a computer monitor, a touchscreen, a television, and so on. In some embodiments, inputs 916 can include any suitable input devices and/or sensors that can be used to receive user input, such as a keyboard, a mouse, a touchscreen, a microphone, and so on.

In some embodiments, communications systems 918 can include any suitable hardware, firmware, and/or software for communicating information over communication network 854 and/or any other suitable communication networks. For example, communications systems 918 can include one or more transceivers, one or more communication chips and/or chip sets, and so on. In a more particular example, communications systems 918 can include hardware, firmware, and/or software that can be used to establish a Wi-Fi connection, a Bluetooth connection, a cellular connection, an Ethernet connection, and so on.

In some embodiments, memory 920 can include any suitable storage device or devices that can be used to store instructions, values, data, or the like, that can be used, for example, by processor 912 to present content using display 914, to communicate with one or more computing devices 850, and so on. Memory 920 can include any suitable volatile memory, non-volatile memory, storage, or any suitable combination thereof. For example, memory 920 can include RAM, ROM, EPROM, EEPROM, other types of volatile memory, other types of non-volatile memory, one or more types of semi-volatile memory, one or more flash drives, one or more hard disks, one or more solid state drives, one or more optical drives, and so on. In some embodiments, memory 920 can have encoded thereon a server program for controlling operation of server 852. In such embodiments, processor 912 can execute at least a portion of the server program to transmit information and/or content (e.g., data, images, a user interface) to one or more computing devices 850, receive information and/or content from one or more computing devices 850, receive instructions from one or more devices (e.g., a personal computer, a laptop computer, a tablet computer, a smartphone), and so on.

In some embodiments, the server 852 is configured to perform the methods described in the present disclosure. For example, the processor 912 and memory 920 can be configured to perform the methods described herein (e.g., the method of FIG. 1; the method of FIG. 4; and/or the method of FIG. 7).

In embodiments, data source 802 can include a processor 922, one or more data acquisition systems 924, one or more communications systems 926, and/or memory 928. In some embodiments, processor 922 can be any suitable hardware processor or combination of processors, such as a CPU, a GPU, and so on. In some embodiments, the one or more data acquisition systems 924 are generally configured to acquire data, images, or both, and can include an MRI system. Additionally or alternatively, in some embodiments, the one or more data acquisition systems 924 can include any suitable hardware, firmware, and/or software for coupling to and/or controlling operations of an MRI system. In some embodiments, one or more portions of the data acquisition system(s) 924 can be removable and/or replaceable.

Note that, although not shown, data source 802 can include any suitable inputs and/or outputs. For example, data source 802 can include input devices and/or sensors that can be used to receive user input, such as a keyboard, a mouse, a touchscreen, a microphone, a trackpad, a trackball, and so on. As another example, data source 802 can include any suitable display devices, such as an LCD screen, an LED display, an OLED display, an electrophoretic display, a computer monitor, a touchscreen, a television, etc., one or more speakers, and so on.

In some embodiments, communications systems 926 can include any suitable hardware, firmware, and/or software for communicating information to computing device 850 (and, in some embodiments, over communication network 854 and/or any other suitable communication networks). For example, communications systems 926 can include one or more transceivers, one or more communication chips and/or chip sets, and so on. In a more particular example, communications systems 926 can include hardware, firmware, and/or software that can be used to establish a wired connection using any suitable port and/or communication standard (e.g., VGA, DVI video, USB, RS-232, etc.), Wi-Fi connection, a Bluetooth connection, a cellular connection, an Ethernet connection, and so on.

In some embodiments, memory 928 can include any suitable storage device or devices that can be used to store instructions, values, data, or the like, that can be used, for example, by processor 922 to control the one or more data acquisition systems 924, and/or receive data from the one or more data acquisition systems 924; to generate images from data; present content (e.g., data, images, a user interface) using a display; communicate with one or more computing devices 850; and so on. Memory 928 can include any suitable volatile memory, non-volatile memory, storage, or any suitable combination thereof. For example, memory 928 can include RAM, ROM, EPROM, EEPROM, other types of volatile memory, other types of non-volatile memory, one or more types of semi-volatile memory, one or more flash drives, one or more hard disks, one or more solid state drives, one or more optical drives, and so on. In some embodiments, memory 928 can have encoded thereon, or otherwise stored therein, a program for controlling operation of medical image data source 802. In such embodiments, processor 922 can execute at least a portion of the program to generate images, transmit information and/or content (e.g., data, images, a user interface) to one or more computing devices 850, receive information and/or content from one or more computing devices 850, receive instructions from one or more devices (e.g., a personal computer, a laptop computer, a tablet computer, a smartphone, etc.), and so on.

In some embodiments, any suitable computer-readable media can be used for storing instructions for performing the functions and/or processes described herein. For example, in some embodiments, computer-readable media can be transitory or non-transitory. For example, non-transitory computer-readable media can include media such as magnetic media (e.g., hard disks, floppy disks), optical media (e.g., compact discs, digital video discs, Blu-ray discs), semiconductor media (e.g., RAM, flash memory, EPROM, EEPROM), any suitable media that is not fleeting or devoid of any semblance of permanence during transmission, and/or any suitable tangible media. As another example, transitory computer-readable media can include signals on networks, in wires, conductors, optical fibers, circuits, or any suitable media that is fleeting and devoid of any semblance of permanence during transmission, and/or any suitable intangible media.

As used herein in the context of computer implementation, unless otherwise specified or limited, the terms "component," "system," "module," "framework," and the like are intended to encompass part or all of computer-related systems that include hardware, software, a combination of hardware and software, or software in execution. For example, a component may be, but is not limited to being, a processor device, a process being executed (or executable) by a processor device, an object, an executable, a thread of execution, a computer program, or a computer. By way of illustration, both an application running on a computer and the computer can be a component. One or more components (or system, module, and so on) may reside within a process or thread of execution, may be localized on one computer, may be distributed between two or more computers or other processor devices, or may be included within another component (or system, module, and so on).

In some implementations, devices or systems disclosed herein can be utilized or installed using methods embodying aspects of the disclosure. Correspondingly, description herein of particular features, capabilities, or intended purposes of a device or system is generally intended to inherently include disclosure of a method of using such features for the intended purposes, a method of implementing such capabilities, and a method of installing disclosed (or otherwise known) components to support these purposes or capabilities. Similarly, unless otherwise indicated or limited, discussion herein of any method of manufacturing or using a particular device or system, including installing the device or system, is intended to inherently include disclosure, as embodiments of the disclosure, of the utilized features and implemented capabilities of such device or system.

Figure 10:
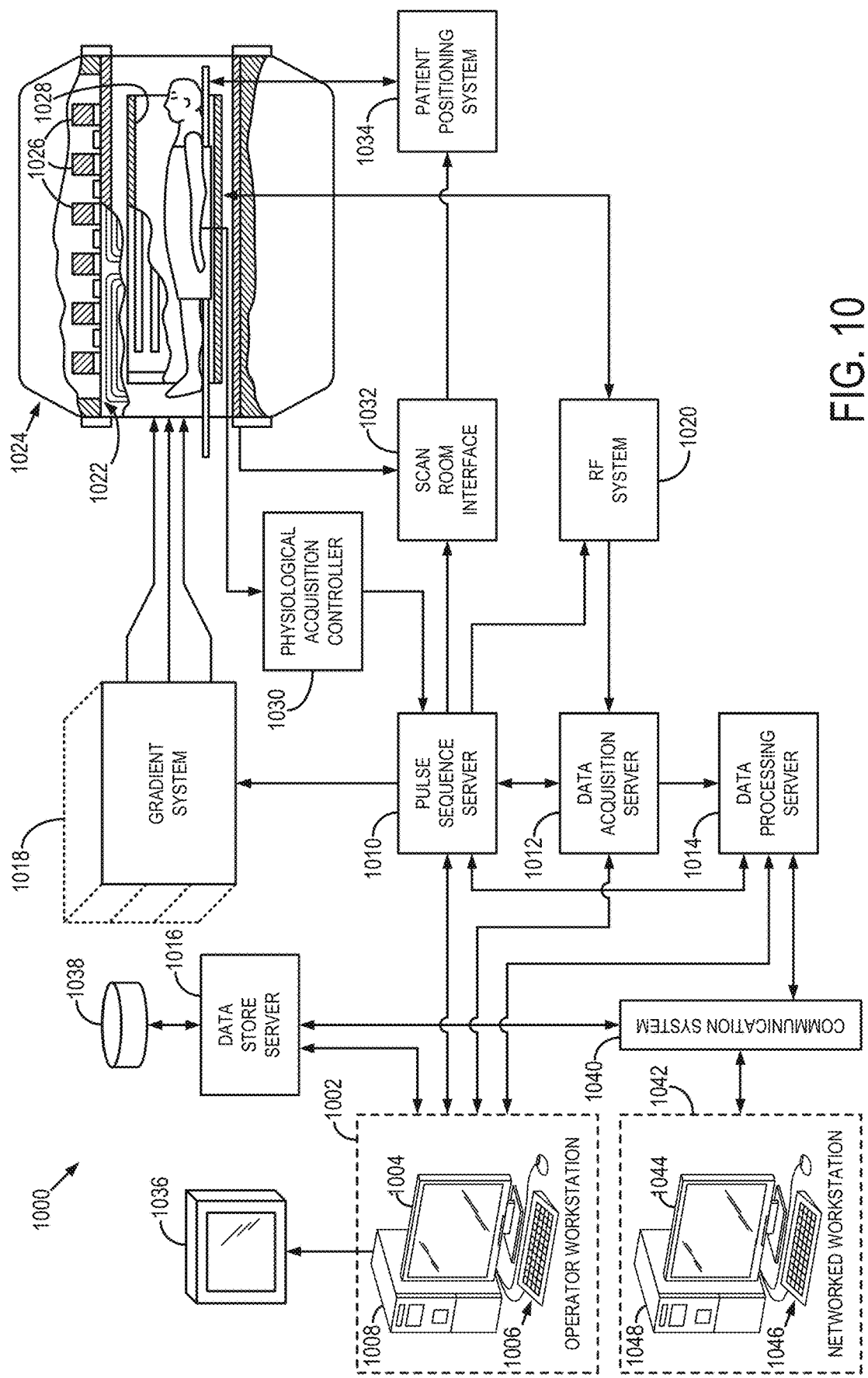
FIG. 10 is a block diagram of an example MRI system that can implement some embodiments described in the present disclosure.

Referring particularly now to FIG. 10, an example of an MRI system 1000 that can implement the methods described here is illustrated. The MRI system 1000 includes an operator workstation 1002 that may include a display 1004, one or more input devices 1006 (e.g., a keyboard, a mouse), and a processor 1008. The processor 1008 may include a commercially available programmable machine running a commercially available operating system. The operator workstation 1002 provides an operator interface that facilitates entering scan parameters into the MRI system 1000. The operator workstation 1002 may be coupled to different servers, including, for example, a pulse sequence server 1010, a data acquisition server 1012, a data processing server 1014, and a data store server 1016. The operator workstation 1002 and the servers 1010, 1012, 1014, and 1016 may be connected via a communication system 1040, which may include wired or wireless network connections.

The pulse sequence server 1010 functions in response to instructions provided by the operator workstation 1002 to operate a gradient system 1018 and a radiofrequency ("RF") system 1020. Gradient waveforms for performing a prescribed scan are produced and applied to the gradient system 1018, which then excites gradient coils in an assembly 1022 to produce the magnetic field gradients $G_x$, $G_y$, and $G_z$ that are used for spatially encoding magnetic resonance signals. The gradient coil assembly 1022 forms part of a magnet assembly 1024 that includes a polarizing magnet 1026 and a whole-body RF coil 1028.

RF waveforms are applied by the RF system 1020 to the RF coil 1028, or a separate local coil to perform the prescribed magnetic resonance pulse sequence. Responsive magnetic resonance signals detected by the RF coil 1028, or a separate local coil, are received by the RF system 1020. The responsive magnetic resonance signals may be amplified, demodulated, filtered, and digitized under direction of commands produced by the pulse sequence server 1010. The RF system 1020 includes an RF transmitter for producing a wide variety of RF pulses used in MRI pulse sequences. The RF transmitter is responsive to the prescribed scan and direction from the pulse sequence server 1010 to produce RF pulses of the desired frequency, phase, and pulse amplitude waveform. The generated RF pulses may be applied to the whole-body RF coil 1028 or to one or more local coils or coil arrays.

The RF system 1020 also includes one or more RF receiver channels. An RF receiver channel includes an RF preamplifier that amplifies the magnetic resonance signal received by the coil 1028 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2};$$

and the phase of the received magnetic resonance signal may also be determined according to the following relationship:

$$\varphi = \tan^{-1}\left(\frac{Q}{I}\right).$$

The pulse sequence server 1010 may receive patient data from a physiological acquisition controller 1030. By way of example, the physiological acquisition controller 1030 may receive signals from a number of different sensors connected to the patient, including electrocardiograph ("ECG") signals from electrodes, or respiratory signals from a respiratory bellows or other respiratory monitoring devices. These signals may be used by the pulse sequence server 1010 to synchronize, or "gate," the performance of the scan with the subject's heart beat or respiration.

The pulse sequence server 1010 may also connect to a scan room interface circuit 1032 that receives signals from various sensors associated with the condition of the patient and the magnet system. Through the scan room interface circuit 1032, a patient positioning system 1034 can receive commands to move the patient to desired positions during the scan.

The digitized magnetic resonance signal samples produced by the RF system 1020 are received by the data acquisition server 1012. The data acquisition server 1012 operates in response to instructions downloaded from the operator workstation 1002 to receive the real-time magnetic resonance data and provide buffer storage, so that data is not lost by data overrun. In some scans, the data acquisition server 1012 passes the acquired magnetic resonance data to the data processor server 1014. In scans that require information derived from acquired magnetic resonance data to control the further performance of the scan, the data acquisition server 1012 may be programmed to produce such information and convey it to the pulse sequence server 1010. For example, during pre-scans, magnetic resonance data may be acquired and used to calibrate the pulse sequence performed by the pulse sequence server 1010. As another example, navigator signals may be acquired and used to adjust the operating parameters of the RF system 1020 or the gradient system 1018, or to control the view order in which k-space is sampled. In still another example, the data acquisition server 1012 may also process magnetic resonance signals used to detect the arrival of a contrast agent in a magnetic resonance angiography ("MRA") scan. For example, the data acquisition server 1012 may acquire magnetic resonance data and processes it in real-time to produce information that is used to control the scan.

In some embodiments, the pulse sequence server 1010 and/or the data acquisition server 1012 can also be configured to control the operation of one or more peripheral devices to instruct a subject to perform a functional task, to provide a stimulus (e.g., visual stimulus, auditory stimulus) in connection with the subject performing a functional task, or to otherwise facilitate the performance of a functional task.

The data processing server 1014 receives magnetic resonance data from the data acquisition server 1012 and processes the magnetic resonance data in accordance with instructions provided by the operator workstation 1002. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 1014 are conveyed back to the operator workstation 1002 for storage. Real-time images may be stored in a data base memory cache, from which they may be output to operator display 1002 or a display 1036. Batch mode images or selected real time images may be stored in a host database on disc storage 1038. When such images have been reconstructed and transferred to storage, the data processing server 1014 may notify the data store server 1016 on the operator workstation 1002. The operator workstation 1002 may be used by an operator to archive the images, produce films, or send the images via a network to other facilities.

The MRI system 1000 may also include one or more networked workstations 1042. For example, a networked workstation 1042 may include a display 1044, one or more input devices 1046 (e.g., a keyboard, a mouse), and a processor 1048. The networked workstation 1042 may be located within the same facility as the operator workstation 1002, or in a different facility, such as a different healthcare institution or clinic.

The networked workstation 1042 may gain remote access to the data processing server 1014 or data store server 1016 via the communication system 1040. Accordingly, multiple networked workstations 1042 may have access to the data processing server 1014 and the data store server 1016. In this manner, magnetic resonance data, reconstructed images, or other data may be exchanged between the data processing server 1014 or the data store server 1016 and the networked workstations 1042, such that the data or images may be remotely processed by a networked workstation 1042.

The present disclosure has described one or more preferred embodiments, and it should be appreciated that many equivalents, alternatives, variations, and modifications, aside from those expressly stated, are possible and within the scope of the invention.

The invention claimed is:

1. A method for functional magnetic resonance imaging, the method comprising:
    (a) accessing functional magnetic resonance imaging (fMRI) signal data using a computer system, wherein the fMRI signal data have been acquired from a subject using a magnetic resonance imaging (MRI) system;
    (b) accessing bias characterization data with the computer system, wherein the bias characterization data are indicative of at least one of subject-specific biases affecting the fMRI signal data or hardware-specific biases affecting the fMRI signal data;
    (c) accessing a neural network with the computer system, wherein the neural network has been trained on training data to remove biases from fMRI signal data;
    (d) inputting the fMRI signal data and the bias characterization data to the neural network using the computer system, generating output as bias-reduced fMRI signal data; and
    (e) storing the bias-reduced fMRI signal data via the computer system.

2. The method of claim 1, wherein accessing the fMRI signal data comprises acquiring the fMRI signal data from the subject using the MRI system.

3. The method of claim 1, wherein the fMRI signal data comprise task-based fMRI signal data acquired from the subject while the subject was performing a task comprising at least one of a cognitive task, a behavioral task, a motor task, or a sensory stimulation task.

4. The method of claim 1, wherein the fMRI signal data comprise resting-state fMRI signal data acquired from the subject while the subject was at rest.

5. The method of claim 1, wherein accessing the bias characterization data comprises generating the bias characterization data from the fMRI signal data using the computer system.

6. The method of claim 5, wherein generating the bias characterization data comprises:
    accessing a second neural network with the computer system, wherein the second neural network has been trained on second training data in order to extract bias characterization maps from fMRI signal data;
    inputting the fMRI signal data to the second neural network, generating output as the bias characterization data.

7. The method of claim 6, wherein the second neural network is a convolutional neural network.

8. The method of claim 7, wherein the convolutional neural network implements a U-Net architecture.

9. The method of claim 6, further comprising:
    forming surface-based data from the fMRI signal data by mapping the fMRI signal data to a cortical surface;
    converting the surface-based data to parameterized surface-based data by mapping the surface-based data into a spherical coordinate system; and
    inputting the parameterized surface-based data to the second neural network in order to generate the output as the bias characterization data.

10. The method of claim 5, wherein the bias characterization data comprise subject-specific bias characterization data associated with at least one of anatomical biases of the subject or physiological biases of the subject.

11. The method of claim 10, wherein the subject-specific bias characterization data comprise a cortical thickness map.

12. The method of claim 10, wherein the subject-specific bias characterization data comprise a cortical orientation map depicting an orientation angle of the subject's cortical surface relative to a main magnetic field of the MRI system.

13. The method of claim 10, wherein the subject-specific bias characterization data comprise a vasculature map.

14. The method of claim 1, wherein the bias characterization data comprise subject-specific bias characterization data associated with at least one of anatomical biases of the subject or physiological biases of the subject.

15. The method of claim 14, wherein the subject-specific bias characterization data comprise a cortical thickness map.

16. The method of claim 14, wherein the subject-specific bias characterization data comprise a cortical orientation map depicting an orientation angle of the subject's cortical surface relative to a main magnetic field of the MRI system.

17. The method of claim 14, wherein the subject-specific bias characterization data comprise a vasculature map.

18. The method of claim 14, wherein the subject-specific bias characterization data are estimated from an atlas.

19. The method of claim 1, wherein the bias characterization data comprise hardware-specific bias characterization data indicative of at least one of biases associated with radio frequency (RF) coil sensitivity or RF coil transmission of the MRI system.

20. The method of claim 19, wherein the hardware-specific bias characterization data comprise coil sensitivity map data.

21. The method of claim 19, wherein the hardware-specific bias characterization data comprise coil transmission profile data.

22. The method of claim 1, wherein the neural network is a convolutional neural network.

23. The method of claim 22, wherein the convolutional neural network implements a U-Net architecture.

24. The method of claim 1, wherein the bias-reduced fMRI signal data comprise fMRI time-series signal data in which at least one of subject-specific biases or hardware-specific biases have been reduced.

25. The method of claim 1, wherein the bias-reduced fMRI signal data comprise functional activation maps in which at least one of subject-specific biases or hardware-specific biases have been reduced.

26. The method of claim 1, wherein the bias-reduced fMRI signal data comprise functional connectivity maps in which at least one of subject-specific biases or hardware-specific biases have been reduced.

27. The method of claim 1, wherein inputting the fMRI signal data to the neural network comprises:
    forming surface-based data from the fMRI signal data by mapping the fMRI signal data to a cortical surface;
    converting the surface-based data to parameterized surface-based data by mapping the surface-based data into a spherical coordinate system; and
    inputting the parameterized surface-based data to the neural network together with the bias characterization data in order to generate the output as the bias-reduced fMRI signal data.

* * * * *